US011257424B2

(12) United States Patent
Baumheinrich et al.

(10) Patent No.: US 11,257,424 B2
(45) Date of Patent: Feb. 22, 2022

(54) DISPLAY DEVICE

(71) Applicant: OSRAM Opto Semiconductors GmbH, Regensburg (DE)

(72) Inventors: Thorsten Frank Baumheinrich, Altdorf (DE); Hubert Halbritter, Dietfurt (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/279,943

(22) Filed: Feb. 19, 2019

(65) Prior Publication Data

US 2019/0259326 A1 Aug. 22, 2019

(30) Foreign Application Priority Data

Feb. 19, 2018 (DE) ......................... 102018103603.5

(51) Int. Cl.

| | |
|---|---|
| ***G09G 3/3225*** | (2016.01) |
| ***G09G 3/32*** | (2016.01) |
| ***H01L 27/32*** | (2006.01) |

(52) U.S. Cl.

CPC ............. *G09G 3/3225* (2013.01); *G09G 3/32* (2013.01); *H01L 27/3244* (2013.01); *G09G 2320/029* (2013.01); *G09G 2360/14* (2013.01)

(58) Field of Classification Search

None

See application file for complete search history.

(56) References Cited

U.S. PATENT DOCUMENTS

| | | | | | |
|---|---|---|---|---|---|
| 9,362,335 | B2 | 6/2016 | von Malm | | |
| 2007/0195044 | A1 * | 8/2007 | Uemoto | G02F 1/133603 | 345/92 |
| 2007/0278500 | A1 * | 12/2007 | Lin | H01L 25/167 | 257/81 |
| 2008/0112164 | A1 * | 5/2008 | Teshirogi | G09G 3/3413 | 362/231 |
| 2008/0245949 | A1 * | 10/2008 | Morimoto | H05B 45/28 | 250/205 |
| 2012/0194493 | A1 * | 8/2012 | Soto | G02F 1/133603 | 345/207 |
| 2013/0106680 | A1 * | 5/2013 | Mashiba | G09G 3/3413 | 345/102 |
| 2014/0098556 | A1 * | 4/2014 | von Malm | F21S 41/143 | 362/543 |
| 2015/0014716 | A1 * | 1/2015 | von Malm | H01L 27/15 | 257/89 |
| 2017/0123542 | A1 * | 5/2017 | Xie | H01L 27/3227 | |

FOREIGN PATENT DOCUMENTS

| | | | |
|---|---|---|---|
| DE | 102014116858 | A1 | 5/2016 |
| DE | 102017101271 | A1 | 7/2018 |

* cited by examiner

*Primary Examiner* — Nitin Patel
*Assistant Examiner* — Amen W Bogale
(74) *Attorney, Agent, or Firm* — Slater Matsil, LLP

(57) ABSTRACT

A display device is disclosed. In an embodiment a display device includes a plurality of image points, each image point comprising at least one active region configured to generate first radiation, a carrier including a drive circuit for the plurality of image points and a detector assigned to at least some image points, the detector configured to receive second radiation, wherein at least some image points are configured to act either as an emitter or as a detector during operation of the display device.

14 Claims, 7 Drawing Sheets

DISPLAY DEVICE

This application claims the benefit of German patent application 102018103603.5, filed on Feb. 19, 2018, which application is hereby incorporated herein by reference.

TECHNICAL FIELD

The present application relates to a display device comprising a plurality of image points.

BACKGROUND

For various applications, such as head-up displays, for example, display devices can be produced as projectors with high image point density. Often, however, an additional camera is desired, so that two separate integrated elements are required in one device.

SUMMARY

Embodiments provide a display device with enlarged functionality.

A display device comprising a plurality of image points is specified. The term “display device” generally refers to a device which emits electromagnetic radiation during operation and in which individual light-emitting regions (image points) can be driven independently of one another.

The image points can each comprise subimage points for generating radiation with different spectral components, for example, for generating a color triad in the red, green and blue spectral range. Alternatively or in addition, an image point or subimage point can be configured for generating radiation in the infrared spectral range. For example, an edge length of an image point or, where applicable, an edge length of a subimage point is between inclusively 1 μm and inclusively 500 μm, in particular between inclusively 2 μm and inclusively 100 μm inclusive.

According to at least one embodiment of the display device, the image points each comprise at least one active region configured for generating radiation. For example, the active region is based on a III-V compound semiconductor material.

III-V compound semiconductor materials are particularly suitable for radiation generation in the ultraviolet (AlxInyGa1-x-yN), over the visible (AlxInyGa1-x-yN, especially for blue to green radiation, or AlxInyGa1-x-yP, especially for yellow to red radiation) up to the infrared (AlxInyGa1-x-yAs) spectral range. Here the following applies respectively: $0 \le x \le 1$, $0 \le y \le 1$ and $x+y \le 1$, in particular with $x \ne 1$, $y \ne 1$, $x \ne 0$ and/or $y \ne 0$. Moreover, high internal quantum efficiencies can be achieved in radiation generation with III-V compound semiconductor materials, in particular from the material systems mentioned.

The active regions of one or several subimage points and/or several image points can result from a common semiconductor layer sequence in the production of the display device. This means that the semiconductor layers of the active regions differ in terms of their material composition and their layer thickness at most within the limits of usual lateral variations in the, in particular epitaxial, deposition of the semiconductor layers. High spatial resolutions can thus be achieved in a simplified manner. For an emission of radiation in different spectral ranges, different radiation conversion elements can be arranged downstream of different image points or subimage points in the radiation direction.

Deviating from this, at least some of the image points can be produced separately from each other and subsequently attached to the carrier. This results in greater freedom in the choice of material for the active regions. In particular, active regions provided for the generation of radiation in different spectral ranges can be formed by different compound semiconductor material systems.

For example, the image points can be luminescent diode chips and the subimage points can be structured areas of a luminescent diode chip.

According to at least one embodiment of the display device, the display device comprises a carrier. For example, the carrier contains a semiconductor material such as silicon.

For example, the carrier is provided to mechanically stabilize the active regions of the image points. This means that the individual image points themselves can have such a small extension in the vertical direction that they would not have sufficient mechanical stability without the carrier. However, the individual image points can also be formed by individual elements which themselves have sufficient mechanical stability and do not require further stabilization by the carrier.

According to at least one embodiment of the display device, the carrier comprises a drive circuit for the plurality of image points. For example, the drive circuit is designed as an active matrix circuit so that the individual image points can be driven independently of each other during operation of the display device. In particular, the drive circuit can be integrated into the carrier, for example, in CMOS technology.

According to at least one embodiment of the display device, a detector of the display device for receiving radiation is assigned to at least some image points. The display device itself thus comprises at least one detector. The detector is specifically configured to detect radiation in a wavelength range which is emitted by the display device during operation, for example, radiation in the ultraviolet, visible and/or infrared spectral range.

In at least one embodiment of the display device, the display device comprises a plurality of image points, each image point comprising at least one active region configured for generating radiation, and the display device comprising a carrier, wherein the carrier comprises a drive circuit for the plurality of image points and wherein a detector of the display device provided for receiving radiation is assigned to at least some image points.

In addition to the image points provided for the generation of radiation, the display device thus comprises one or several detectors for receiving radiation. The display device itself thus offers the functionality of a, in particular spatially resolved, detector, such as a camera, so that the emitters and the detectors do not have to be embodied in two different devices arranged separately next to each other. This results in a higher integration density at component level, which can lead to a cost reduction in production. Furthermore, an alignment between the emitter perspective and the detector perspective can be achieved, especially in comparison to an arrangement in which the emitters and detectors are arranged next to each other in separate components.

According to at least one embodiment of the display device, at least some image points are configured to act either as an emitter or as a detector during operation of the display device. The image points themselves can therefore perform the function of a detector during operation of the display device. For this purpose, the drive circuit can be configured to operate the image points both in the forward direction and in the reverse direction in relation to the forward direction of their active region.

The display device can therefore fulfil the function of a detector or a camera without the need for additional detectors.

Furthermore, the radiation emitted by the display device itself can also be detected by means of the at least one detector. The information obtained therefrom can be input into the control circuit in order to operate the image points with knowledge of this information.

According to at least one embodiment of the display device, the detector is integrated in the carrier with the drive circuit. For example, the detectors as well as the drive circuit are produced in CMOS technology. For example, the control circuit is designed as part of an Application Specific Integrated Circuit (ASIC), wherein this ASIC is also configured for the operation of the at least one detector.

According to at least one embodiment of the display device, the detector is arranged between two image points in plan view of the display device. This means that the detector is not arranged to the side of a matrix comprising the image points, but overlaps with this matrix. An alignment of the perspective for the emitters and the at least one detector can thus be achieved in a simplified manner.

According to at least one embodiment of the display device, the detector overlaps with at least one image point in plan view of the display device. For example, the image points are arranged in a matrix-shaped grid. An image point can comprise two or more subimage points. A detector can be arranged under one, several or all subimage points of an image point.

According to at least one embodiment of the display device, the detector is arranged without overlapping with the image points in a plan view of the display device. For example, three subimage points and a detector are arranged in a 2×2 subimage point matrix for each image point in plan view of the display device. Alternatively or in addition, at least one detector can also be arranged at intermediate grid points between adjacent image points.

According to at least one embodiment of the display device, at least one separate detector is assigned to each image point. Also more than one detector can be assigned to one image point. For example, each subimage point can be assigned its own detector.

For example, each image point comprises at least two subimage points and each subimage point is assigned its own detector. For example, three subimage points form a color triad in the red, green and blue spectral range and a detector that detects radiation in the corresponding spectral range is assigned to each subimage point.

According to at least one embodiment of the display device, at least one detector is assigned to a plurality of image points. In particular, the number of detectors can be smaller than the number of image points. For example, a detector extends continuously over several image points or subimage points in a plan view of the display device.

According to at least one embodiment of the display device, an optical barrier is arranged between the active region of the image points and the detector. The optical barrier is provided to prevent a direct beam path between the active region of the image points and the detector. Optical crosstalk can thus be prevented or at least reduced.

According to at least one embodiment of the display device, the detector comprises a III-V compound semiconductor material. With such detectors, the spectral sensitivity can be adjusted via the band gap of the photosensitive region. In particular, spectral sensitivity can be adjusted without the need for external filters being arranged on the detector. However, such filters may be there in addition.

According to at least one embodiment of the display device, the detector is based on silicon. Such a detector can be particularly easily integrated into the carrier. Alternatively, the detector can be arranged on the carrier and, for example, be attached to the carrier as a prefabricated component. Detectors based on silicon can be produced at particularly low cost. A filter can be placed upstream of the detector in the beam path so that the detector is sensitive to a certain spectral range, for example, to radiation in the red, blue or green spectral range or in the infrared spectral range.

According to at least one embodiment of the display device, each image point comprises a subimage point respectively for generating radiation in the red, blue and green spectral range and a detector. For example, the detector and the subimage points are arranged next to each other on the carrier. Each image point is thus designed to generate radiation in a color triad of the visible spectral range and at the same time comprises a detector. The number of detectors thus corresponds to the number of image points.

According to at least one embodiment of the display device, the active regions of several image points, or also the active regions of all image points, result from a common semiconductor layer sequence. The image points do not differ in terms of their material composition and their layer thicknesses in the active region, or at least not significantly.

According to at least one embodiment of the display device, the active region of an image point and a photosensitive region of the detector are formed in a common semiconductor layer sequence. The active region of the image point and the photosensitive region of the detector can thus be deposited in a common deposition step, especially in a continuous epitaxial process.

According to at least one embodiment of the display device, the display device is configured to drive the active regions in dependence of a signal of the detector. For example, the signal of the at least one detector can serve for calibration of the image points and/or compensation of ageing and/or control of the output power.

In particular, the detectors can be configured to detect the radiation generated by the image points.

For example, the display device is designed as a light source in a head-up display, a camera, a 3D camera, for a time of flight system or for a so-called "structured light" camera for measuring three-dimensional surfaces.

BRIEF DESCRIPTION OF THE DRAWINGS

Further designs and functionalities result from the following description of the exemplified embodiments in connection with the figures, in which.

In the figures, the same reference numerals are used to denote same, similar or equivalent elements.

The figures are schematic illustrations and therefore are not necessarily true to scale. Rather, comparatively small elements and, in particular, layer thicknesses can be illustrated exaggeratedly large for clarification.

DETAILED DESCRIPTION OF ILLUSTRATIVE EMBODIMENTS

Figure 1A:
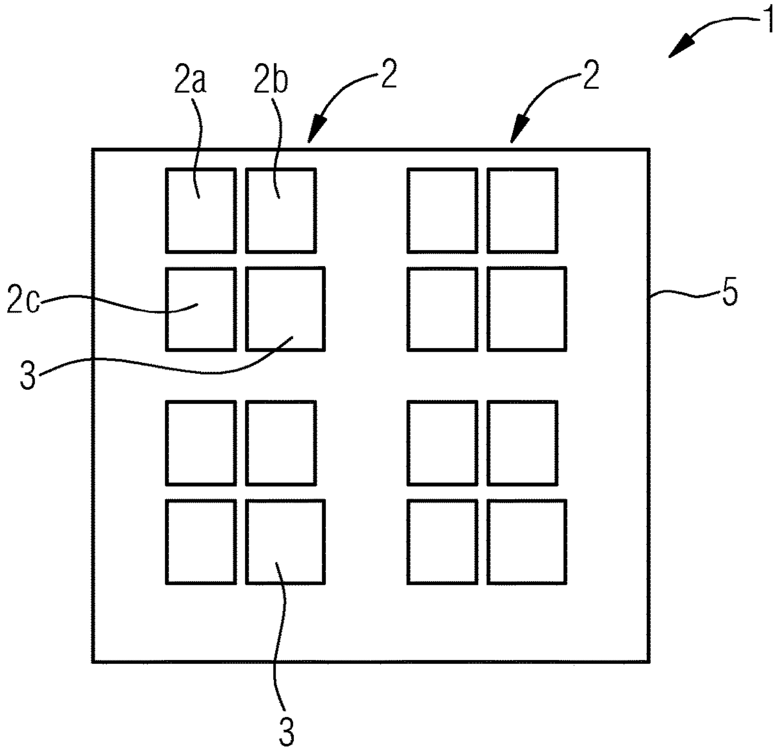
FIGS. 1A and 1B show an exemplified embodiment of a display device in plan view (FIG. 1A) and in side view (FIG. 1B)
Figure 1B:
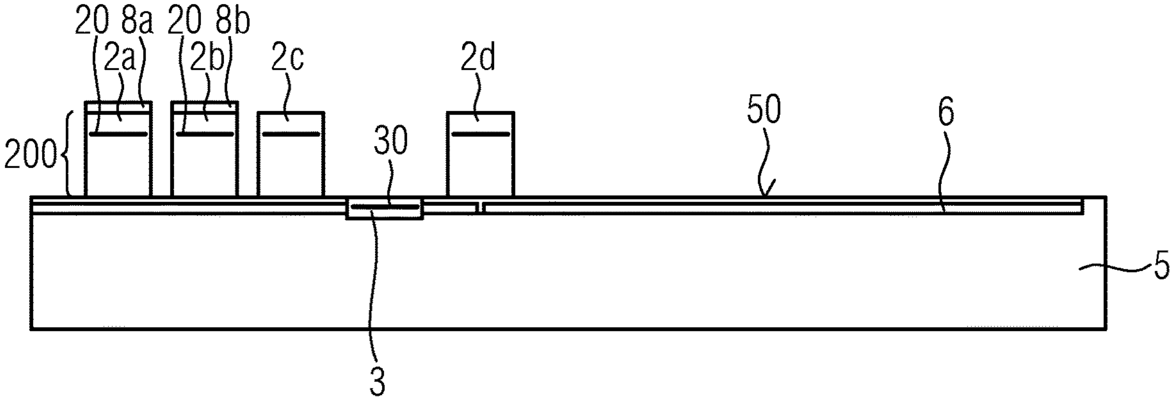

FIGS. 1A and 1B show an exemplified embodiment of a display device. The display device 1 comprises a plurality of image points 2. The image points 2 are arranged in matrix-shaped manner. For a simplified illustration, only a section with a total of four image points 2 is shown. The number of image points can be varied within wide limits, for example, between inclusively 50 and inclusively 10 million.

The image points 2 each comprise subimage points 2*a*, 2*b* and 2C, which are configured to generate radiation in the green, red or blue spectral range. Furthermore, a detector 3 is assigned to each image point 2.

Alternatively or additionally, the image point 2 can also comprise a subimage point 2*d*, which emits radiation in the infrared spectral range. This is shown in the side view in FIG. 1B. For a simplified illustration, FIG. 1B shows only the emitters and the detector of one image point, wherein the individual emitters and the detector of one image point are shown side by side.

The display device 1 comprises a carrier 5 which comprises a drive circuit 6 for the plurality of image points 2. Here, the detectors 3 are located at positions of the carrier 5 where no image points 2 are placed.

The detectors 3 each comprise a photosensitive region 30 in which the incident radiation causes an electrical signal.

In this exemplified embodiment, the detectors 3 are integrated in the carrier 5. Thus, the photosensitive regions 30 of the detectors 3 are located in the carrier 5, in which also the drive circuit of the image points 2 is formed. The detectors 3 and drive circuit 6 can be integrated into the carrier 5, especially in CMOS technology.

The image points 2 are arranged on a main surface 50 of the carrier 5 and are attached to it in particular.

The image points 2 each comprise an active region 20 for generating radiation, for example, radiation in the blue spectral range. The primary radiation generated in the active region can be converted to secondary radiation in another spectral range by means of a radiation conversion material 8*a*, 8*b*, so that, for example, the subimage point 2*a* emits secondary radiation in the green spectral range and the subimage point 2*b* emits secondary radiation in the red spectral range, whereas the subimage point 2*c* emits primary radiation in the blue spectral range.

Thus, the display device 1 comprises a detector 3 for each image point 2 comprising a color triad in the red, green and blue spectral range.

In contrast to an arrangement in which emitters and detectors are arranged side by side in two separate matrix arrangements, the detectors 3 and the subimage points of one image point 2 have the same perspective. An optical element can be arranged downstream of the display device 1, wherein both the radiation to be emitted and the radiation to be detected passes through the optical element. For example, the optical element projects the radiation emitted by the image points 2 and concentrates the radiation incident on the display device onto the associated detectors 3. This reduces the number of optical elements required.

For example, the image points 2 or subimage points 2*a*, 2*b*, 2*c*, 2*d* are luminescent diodes, such as incoherent emitters, such as light-emitting diodes or light-emitting diodes with resonant cavity (RCLED), or coherent emitters, for example, surface-emitting lasers with vertical cavity (Vertical Cavity Surface Emitting Laser, VCSEL).

During the production of the display device 1, the image points 2 can result from a common semiconductor layer sequence 200. For example, a complete wafer, such as a sapphire wafer, comprising light-emitting structures arranged on it is bonded to a functional silicon wafer. Advantageously, areas of the wafer with the light-emitting structures where a detector is located after bonding are omitted when producing reflective layers such as a silver mirror or when forming a roughening.

For example, the semiconductor layer sequence 200 provided for the image points 2, which comprises the active regions 20, is epitaxially deposited on a growth substrate and attached to the carrier 5. After attachment, the carrier 5 can mechanically stabilize the semiconductor layer sequence so that the growth substrate can be removed. Thus, a particularly high density of image points 2 can be achieved. Such a display device per se, i.e., without detectors, and a method for producing such a display device are described in the publication U.S. Pat. No. 9,362,335, the entire disclosure content of which is hereby explicitly incorporated by reference.

Alternatively, individual image points 2 can, for example, be transferred to a functional silicon carrier which already comprises the drive circuit 6. The image points 2 or the individual subimage points 2*a*, 2*b*, 2*c* can thus also be formed by individual, independently produced components which are attached to the carrier 5.

Figure 2:
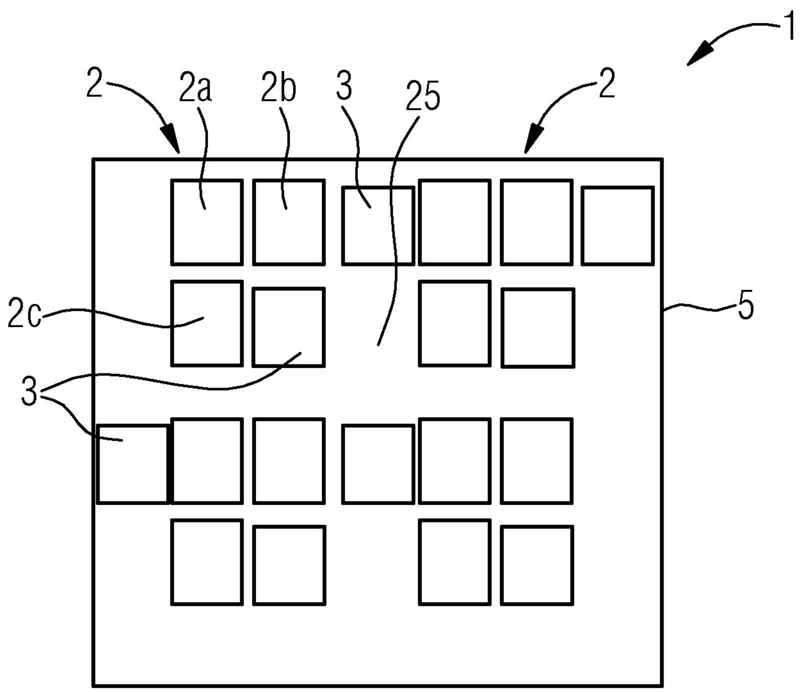
FIGS. 2 and 3 each show an exemplified embodiment of a display device in plan view.

The exemplified embodiment shown in FIG. 2 essentially corresponds to the exemplified embodiment described in connection with FIGS. 1A and 1B. In contrast thereto, some or all detectors 3 are arranged at intermediate grid points between adjacent image points 2. The detectors thus use interspaces 25 between adjacent image points of the display device 1. Furthermore, the detectors can also be distributed unevenly over the display device 1, so that at least one portion of the display device has a higher density of detectors than another portion spaced apart thereof.

Figure 3:
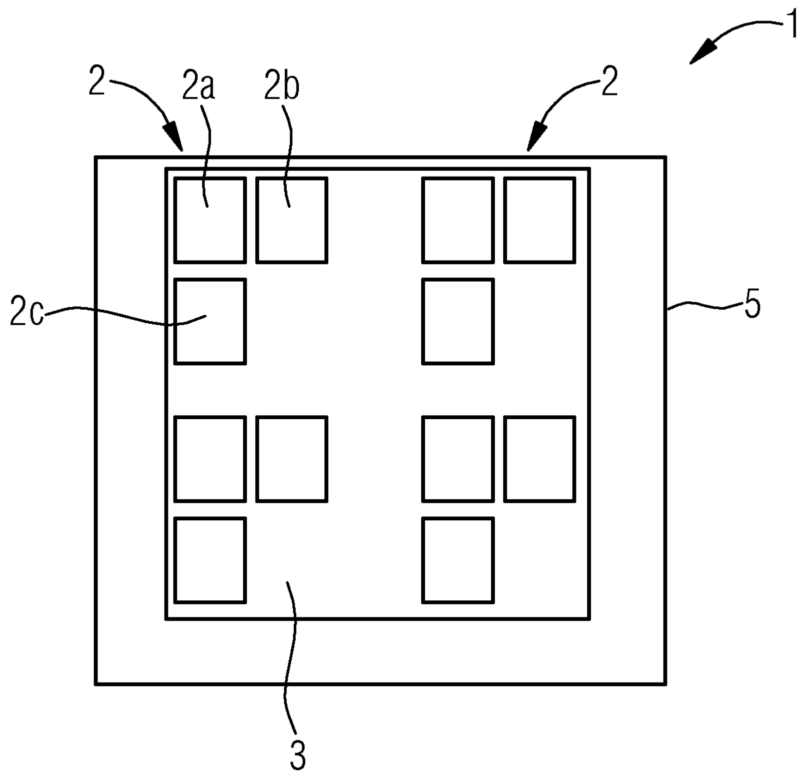

The exemplified embodiment shown in FIG. 3 essentially corresponds to the exemplified embodiment described in connection with FIGS. 1A and 1B. In contrast thereto, a detector 3 is assigned to several image points 2. For example, the image points are divided into several groups, wherein a detector is assigned to at least some groups or to each group. In top view of the display device 1, a detector 3 can extend continuously over several image points 2.

Such a design is particularly advantageous if a lower spatial resolution is required for the radiation to be received than for the image points. Furthermore, a larger lateral extension of the photosensitive region of the detectors typically improves the signal-to-noise ratio.

For example, the detectors 3 are provided to track the pupil movement of the human eye.

Figure 4A:
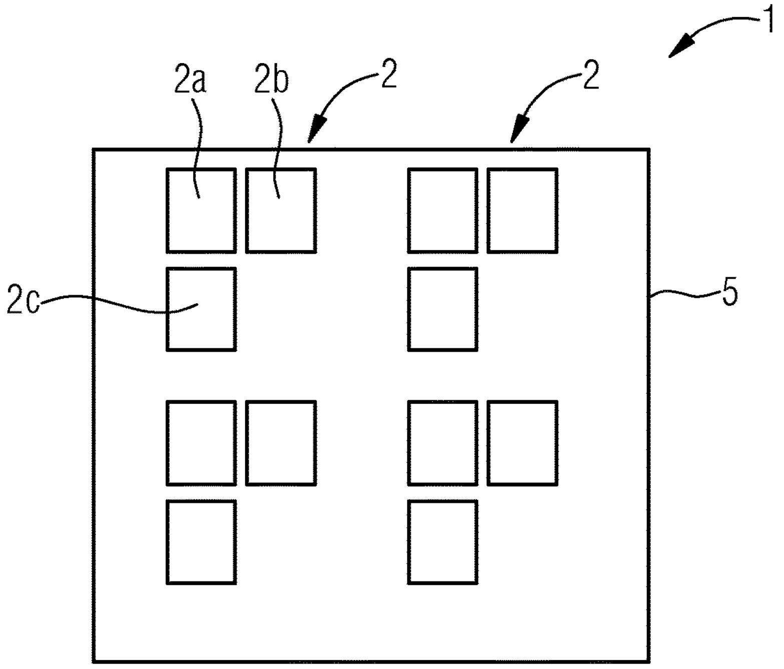
FIGS. 4A and 4B show an exemplified embodiment of a display device in plan view (FIG. 4A) and in side view (FIG. 4B)
Figure 4B:
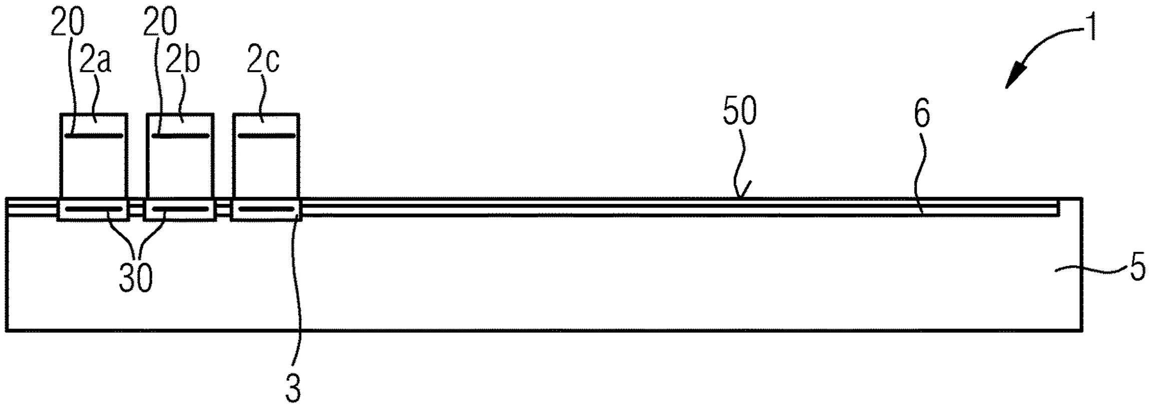

The exemplified embodiment shown in FIGS. 4A and 4B essentially corresponds to the exemplified embodiment described in connection with FIGS. 1A and 1B. In contrast thereto, a detector 3 is assigned to each subimage point 2*a*,

2*b*, 2*c* of the image points 2. The number of detectors thus corresponds to the number of subimage points of an image point. In addition, the detectors 3 are arranged in an overlapping way with the subimage points 2*a*, 2*b*, 2C in plan view of the display device. In particular, the detectors are each located below the corresponding subimage points. The detectors 3 can in particular be used to receive the radiation emitted by the corresponding subimage points 2*a*, 2*b*, 2*c*. The information obtained therefrom can be input into the drive circuit 6 so that the image points 2 can be driven with knowledge of the signal of the detectors 3. This can be used, for example, to calibrate the individual image points 2 or the individual subimage points 2*a*, 2*b*, 2*c*, or to completely or partly compensate for aging effects by changing the drive of the individual subimage points or image points during operation of the display device. Alternatively or in addition, the emitted light output can be controlled. In the beam path between the detectors 3 and the subimage points 2*a*, 2*b*, 2*c* a filter can be optionally provided (not explicitly shown).

Figure 5A:
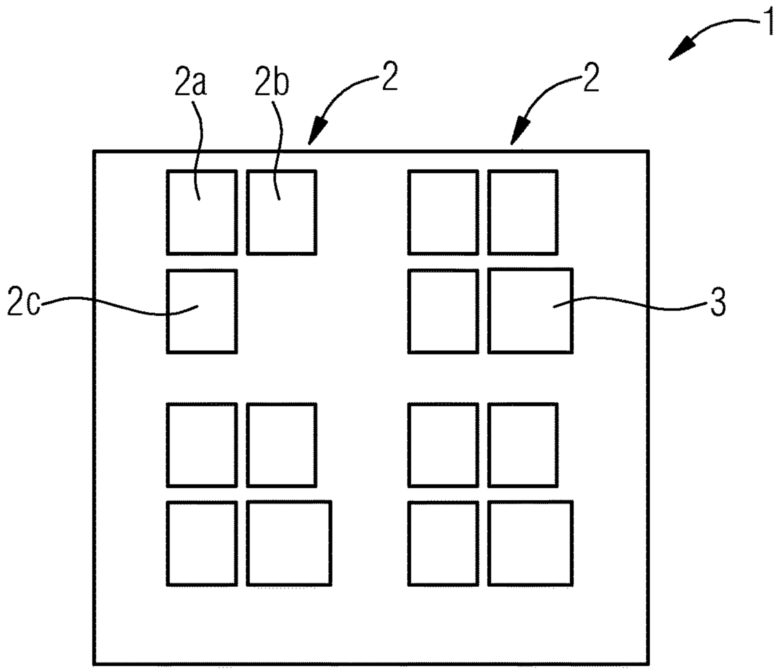
FIGS. 5A and 5B show an exemplified embodiment of a display device in plan view (FIG. 5A) and in side view (FIG. 5B)
Figure 5B:
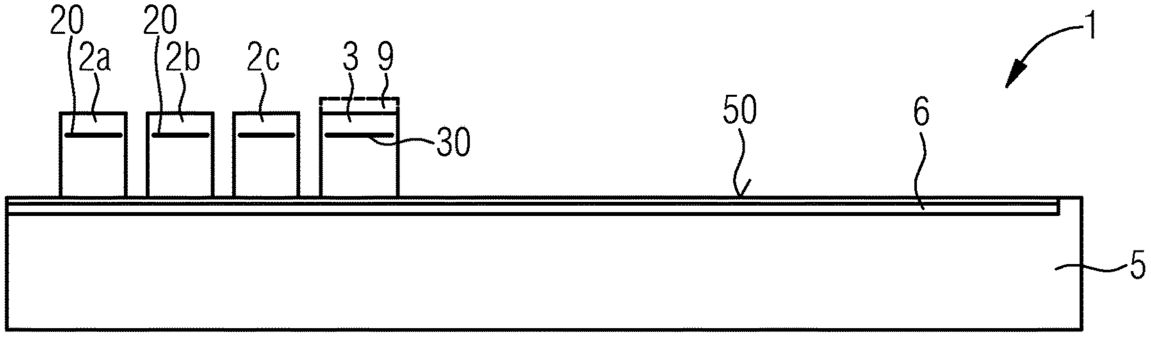

The exemplified embodiment shown in FIGS. 5A and 5B essentially corresponds to the exemplified embodiment described in connection with FIGS. 1A and 1B. In contrast thereto, a detector 3 is assigned to some or all image points 2, wherein the detector 3 is arranged next to the subimage points 2*a*, 2, 2*c* on the carrier 5. Thus, the detectors 3 are not integrated into the carrier 5, but attached to it as separate components. In this case, for example, a III-V compound semiconductor material can also be used for the detector. In such compound semiconductor material systems, the spectral sensitivity of detector 3 can be adjusted via the material composition of the photosensitive region. Alternatively, a detector 3 arranged on the carrier 5, however, can also be designed as a silicon detector. Such detectors can be produced at particularly low cost. The spectral sensitivity, for example, can be adjusted via an optional filter 9 arranged upstream.

Figure 6A:
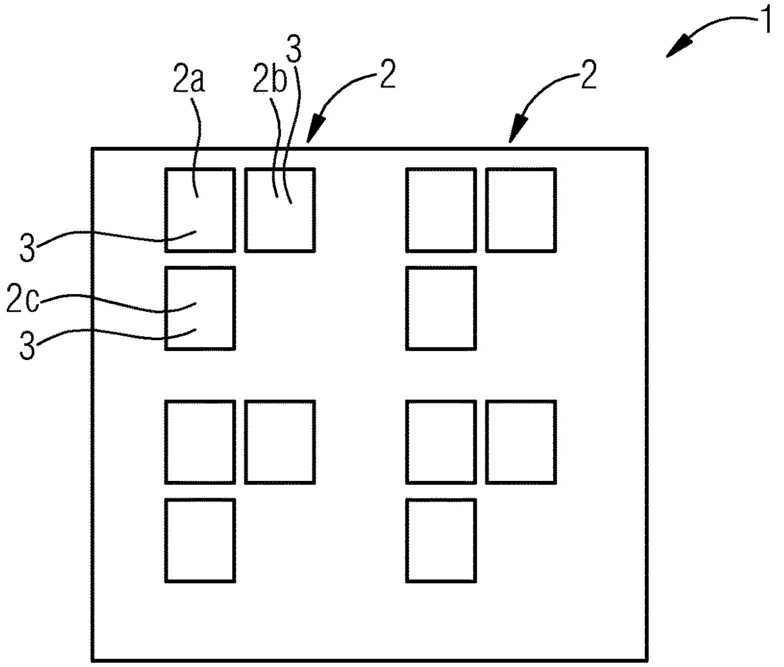
FIGS. 6A and 6B show an exemplified embodiment of a display device in plan view (FIG. 6A) and in side view (FIG. 6B)
Figure 6B:
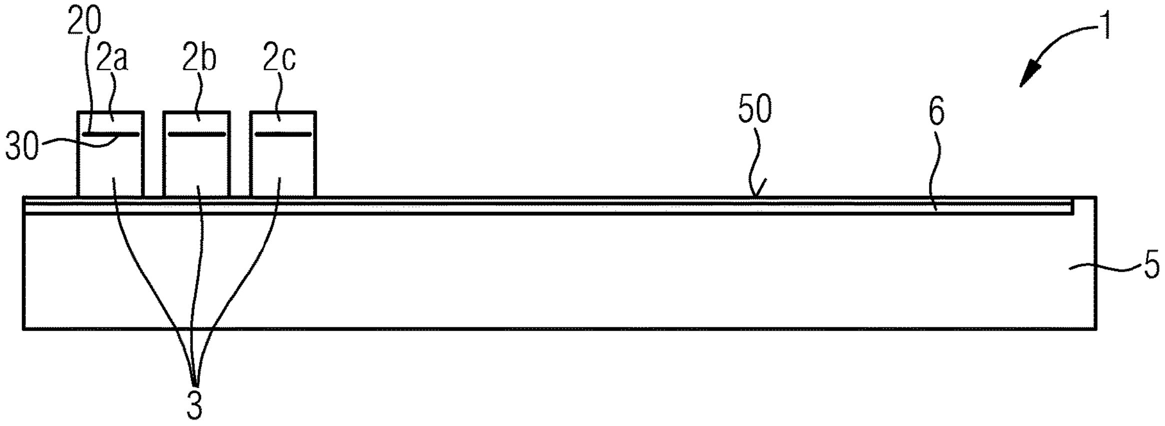

The exemplified embodiment shown in FIGS. 6A and 6B essentially corresponds to the exemplified embodiment described in connection with FIGS. 1A and 1B. In contrast thereto, at least some or all of the image points of the display device are configured to act either as an emitter or as a detector during operation of the display device. The image points 2 can therefore act as detectors in times when they themselves do not emit any radiation. In other words, the active regions 20 of one or several image points also serve as photosensitive regions 30 of a detector. Additional detectors are therefore not required for the display device.

For example, the drive circuit 6 is designed in such a way that the active regions 20 of the image points 2 can be operated both in the forward direction and in the reverse direction. When operating in the reverse direction, the image points 2 can act as detectors 3.

Figure 7A:
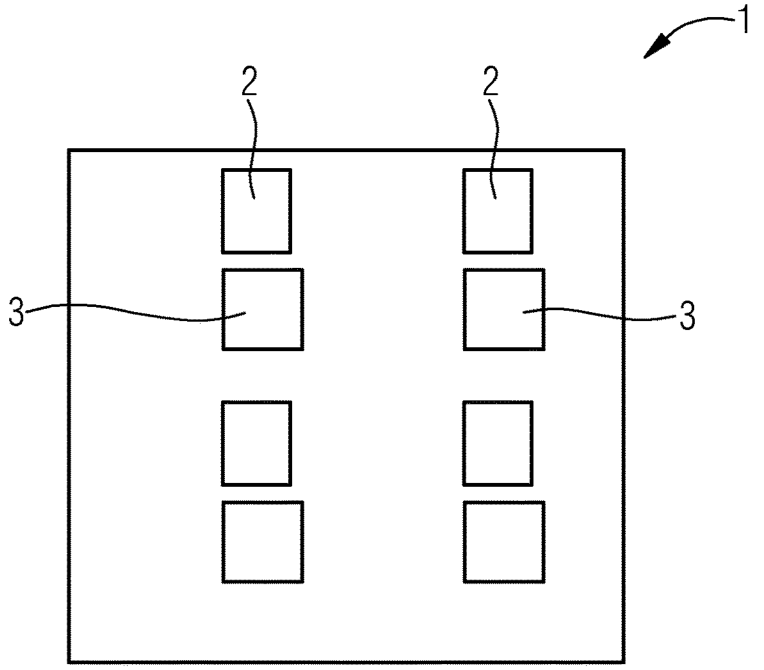
FIGS. 7A and 7B show an exemplified embodiment of a display device in plan view (FIG. 7A) and in side view (FIG. 7B)
Figure 7B:
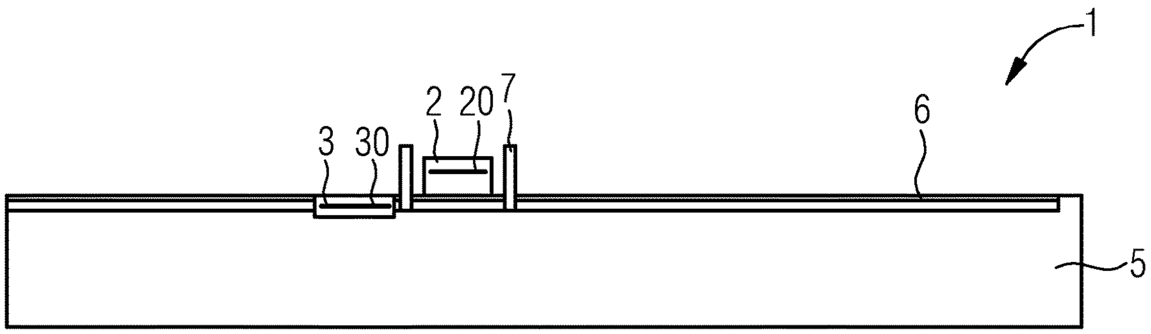

The exemplified embodiment shown in FIGS. 7A and 7B essentially corresponds to the exemplified embodiment described in connection with FIGS. 1A and 1B. In contrast thereto, each image point 2 does not comprise any subimage points but only one emitter. For example, the image point 2 emits radiation in the infrared spectral range. A detector 3 is assigned to each image point 2. The detector 3 is provided in particular to receive the radiation emitted by the image points 2, in particular after back reflection from a target object.

For example, the display device 1 is designed for a system for time of flight measurement or as a "structured light" camera.

An optical barrier 7 is located in a direct beam path between the image point 2 and the detector 3. For example, the optical barrier 7 completely surrounds either the image point 2 or the detector 3 in the lateral direction. This reduces the amount of radiation coming from the image point 2 or an adjacent image point and strikes detector 3 directly without being reflected by the target object.

Figure 8A:
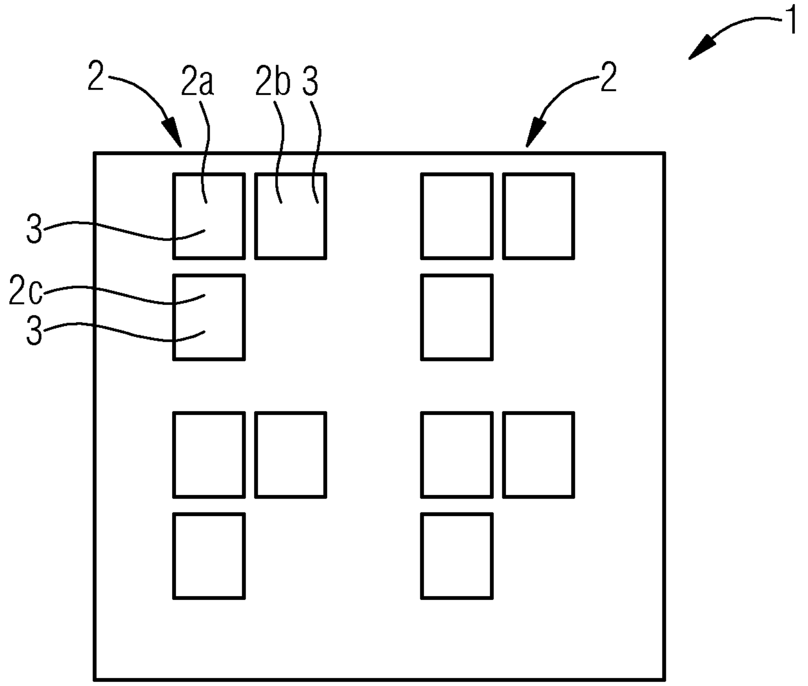
FIGS. 8A and 8B show an exemplified embodiment of a display device in plan view (FIG. 8A) and in side view (FIG. 8B).
Figure 8B:
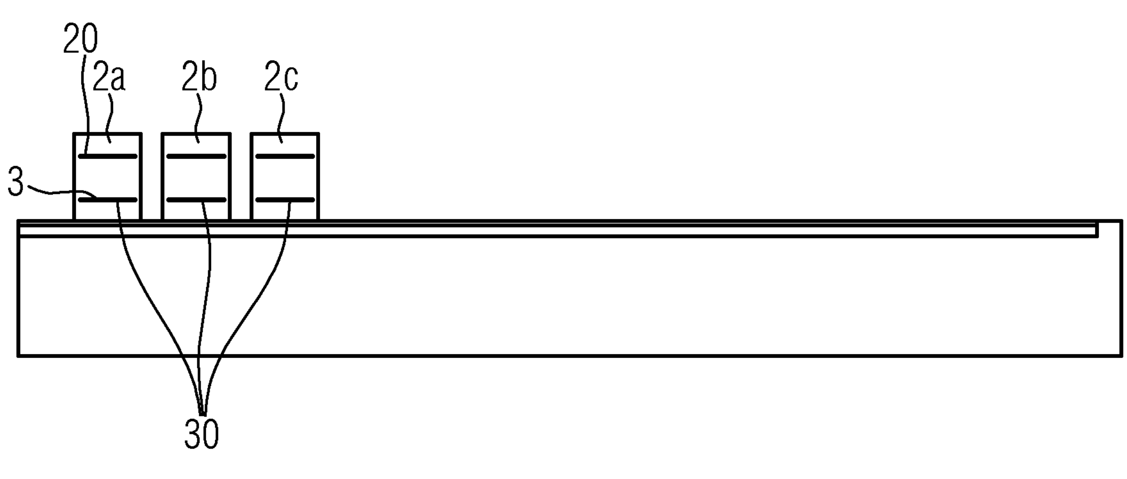

The exemplified embodiment shown in FIGS. 8A and 8B essentially corresponds to the exemplified embodiment described in connection with FIGS. 4A and 4B. In contrast thereto, the detectors 3 are based on a III-V compound semiconductor material. The active regions 20 of the image points 3 and the photosensitive regions 30 of the detectors 3 are arranged in the same semiconductor layer sequence. The integration of the photosensitive regions can therefore already take place during the epitaxial deposition of the semiconductor layer sequence for the image points 2.

The number of detectors 3 may, but does not have to correspond to the number of subimage points 2*a*, 2*b*, 2*c*. Furthermore, the lateral extension of a detector 3 can also be larger than the lateral extension of the active region of the corresponding subimage point arranged on it. For example, a detector 3 can also extend continuously over two or more subimage points 2*a*, 2*b*, 2*c*, for example, over all subimage points 2*a*, 2*b*, 2*c* of one image point 2.

The invention is not limited by the description of the exemplified embodiments. Rather, the invention includes any new feature and any combination of features, which in particular includes any combination of features in the patent claims, even if that feature or combination itself is not explicitly mentioned in the patent claims or the exemplified embodiments.

What is claimed is:

1. A display device comprising:

a plurality of image points, each image point comprising at least one active region configured to generate first radiation;

a carrier comprising a drive circuit configured to drive the plurality of image points; and one or several detectors assigned to at least some image points, the one or several detectors configured to receive second radiation, wherein at least some image points are configured to act either as an emitter or as a detector during operation of the display device, wherein the active regions of several image points are formed from a common semiconductor layer sequence, wherein the image points, which are configured to act either as the emitter or as the detector during the operation of the display device, are configured to detect the first radiation, and wherein some of the image points, whose active regions are configured to generate radiation in different spectral ranges, are formed by different compound semiconductor material systems.

2. The display device according to claim 1, wherein at least one of the several detectors is integrated in the carrier which comprises the drive circuit.

3. The display device according to claim 1, wherein at least one of the one or several detectors is arranged between two image points in plan view of the display device.

4. The display device according to claim 1, wherein at least one of the several detectors overlaps with at least one image point in plan view of the display device.

5. The display device according to claim 1, wherein at least one of the one or several detectors is arranged without overlapping with the image points in plan view of the display device.

6. The display device according to claim 1, wherein at least one separate detector is assigned to each image point.

7. The display device according to claim 1, wherein each image point comprises at least two subimage points and a separate detector is assigned to each subimage point.

8. The display device according to claim 1, wherein at least one detector is assigned to a plurality of image points.

9. The display device according to claim 1, wherein an optical barrier is arranged between the active regions of the image points and the one or several detectors.

10. The display device according to claim 1, wherein the one or several detectors comprise a III-V compound semiconductor material.

11. The display device according to claim 1, wherein at least one of the several detectors is based on silicon.

12. The display device according to claim 1, wherein each image point comprises a respective subimage point configured to generate radiation in a red spectral range, a blue spectral range and a green spectral range, and a detector, and wherein the detector and the subimage points are arranged side by side on the carrier.

13. The display device according to claim 1, wherein the active region of the image point and a photosensitive region of the one or several detectors are formed in the common semiconductor layer sequence.

14. The display device according to claim 1, wherein the display device is configured to drive the active regions depending on a signal of the one or several detectors.

* * * * *